(12) United States Patent
Zhang et al.

(10) Patent No.: US 9,634,014 B2
(45) Date of Patent: Apr. 25, 2017

(54) METHOD OF MAKING A PROGRAMMABLE CELL AND STRUCTURE THEREOF

(71) Applicant: Broadcom Corporation, Irvine, CA (US)

(72) Inventors: Qintao Zhang, Tustin, CA (US); Akira Ito, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/692,552

(22) Filed: Apr. 21, 2015

(65) Prior Publication Data

US 2016/0276355 A1  Sep. 22, 2016

Related U.S. Application Data

(60) Provisional application No. 62/135,593, filed on Mar. 19, 2015.

(51) Int. Cl.
| | |
|---|---|
| *H01L 27/112* | (2006.01) |
| *H01L 21/28* | (2006.01) |
| *H01L 23/525* | (2006.01) |
| *H01L 21/265* | (2006.01) |
| *H01L 29/78* | (2006.01) |
| *H01L 29/66* | (2006.01) |
| *H01L 21/311* | (2006.01) |
| *H01L 29/423* | (2006.01) |
| *H01L 21/3115* | (2006.01) |

(52) U.S. Cl.
CPC .. *H01L 27/11206* (2013.01); *H01L 21/26586* (2013.01); *H01L 21/28158* (2013.01); *H01L 21/31111* (2013.01); *H01L 23/5252* (2013.01); *H01L 29/42368* (2013.01); *H01L 29/66795* (2013.01); *H01L 29/7851* (2013.01); *H01L 21/31155* (2013.01)

(58) Field of Classification Search
CPC ......... H01L 21/26586; H01L 21/28158; H01L 21/31155
See application file for complete search history.

(56) References Cited

U.S. PATENT DOCUMENTS 5,844,271 A * 12/1998 Sethi ................ G11C 16/0425
257/315
2002/0079509 A1* 6/2002 Efland ................ H01L 29/086
257/196

* cited by examiner

*Primary Examiner* — Mamadou Diallo
(74) *Attorney, Agent, or Firm* — Foley & Lardner LLP

(57) ABSTRACT

A programmable cell includes a split gate structure. The split gate structure includes a thin gate dielectric region and a thick gate dielectric region disposed below a gate conductor. A thickness of the thick oxide region is more than a thickness of the thin oxide region. The programmable cell can be fabricated using angle doping to dope an area associated with the thin dielectric region.

9 Claims, 6 Drawing Sheets

METHOD OF MAKING A PROGRAMMABLE CELL AND STRUCTURE THEREOF

CROSS-REFERENCE TO RELATED APPLICATIONS

This application claims the benefit of and priority to U.S. Provisional Application No. 62/135,593, entitled "METHOD OF MAKING A PROGRAMMABLE CELL AND STRUCTURE THEREOF," filed Mar. 19, 2015, which is hereby incorporated by reference herein in its entirety.

FIELD OF THE DISCLOSURE

This disclosure generally relates to a programmable cell or a method of fabricating a programmable cell including but not limited to a one-time programmable cell having a split gate.

BACKGROUND OF THE DISCLOSURE

Programmable cells, such as, one-time programmable cells, can be fabricated using a transistor having a split gate architecture. The split gate architecture includes a gate conductor, a thick dielectric portion and a thin dielectric portion. The thick dielectric portion serves as the insulator for the select operation provided via the gate conductor while the thin dielectric portion serves as the insulator for the programming operation provided via the gate conductor. A bit line can be coupled to a source/drain region of the transistor and the gate conductor can serve as the word line. When a normal or select voltage is applied to the gate conductor, the equivalent circuit for the transistor is a capacitor and appreciable current (e.g., current indicative of a first storage state) does not flow to the bit line. When a programming voltage is applied to the gate conductor, the thin oxide portion breaks down and a resistive path from the channel of the transistor to the gate conductor is formed. The equivalent circuit for the transistor is a resistor after the programming voltage is applied and appreciable current does flow to the bit line when a normal voltage (e.g., a voltage for a select operation) is applied to the gate conductor.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
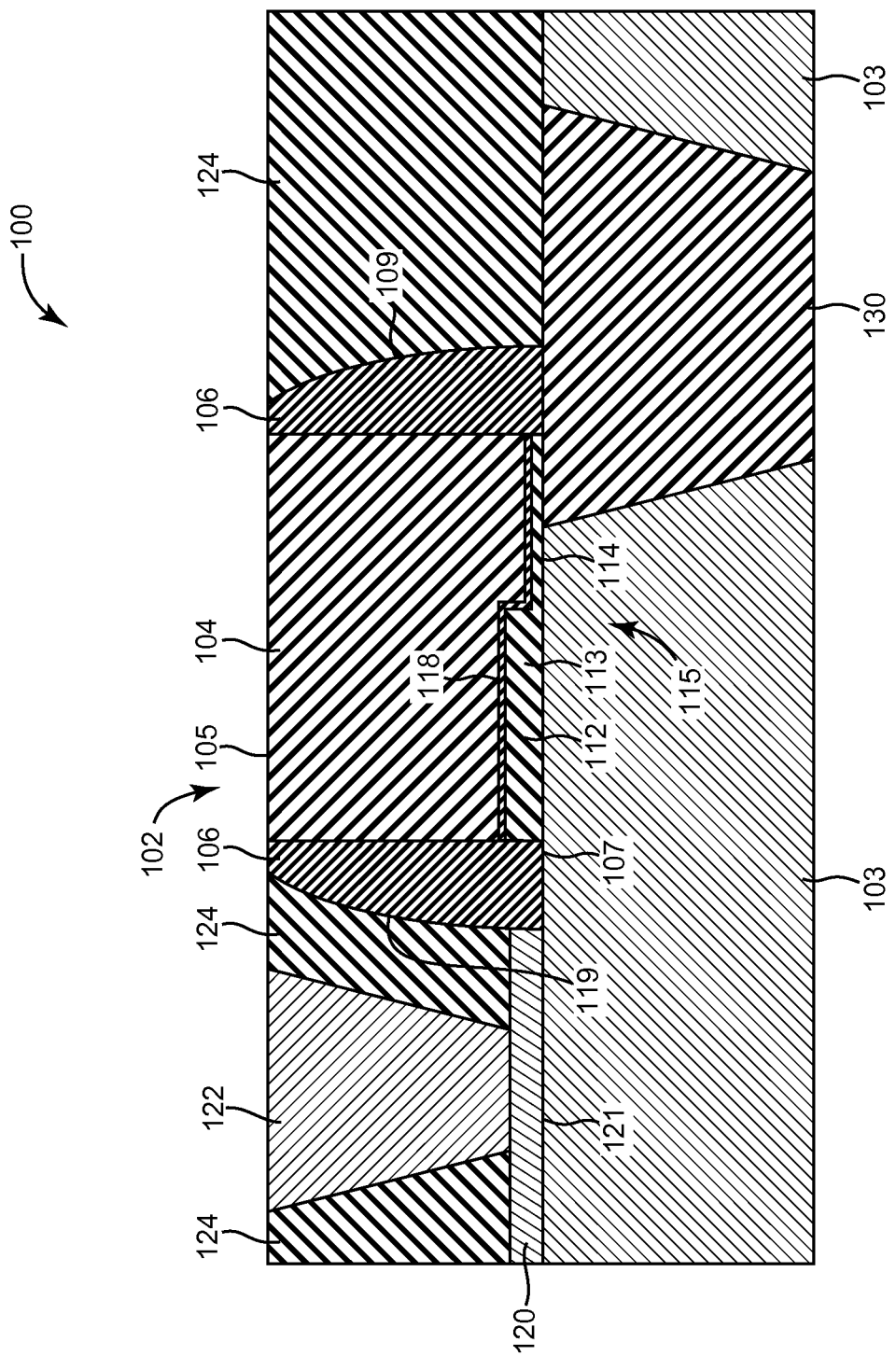
FIG. 1 is a cross sectional view schematic drawing of a programmable memory cell according to some exemplary embodiments.

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, programmable cells and methods of fabricating such cells are shown according to various exemplary embodiments. A programmable cell, such as a one-time programmable (1TP or OTP) cell, can be fabricated using angle doping to provide split gate architecture in some embodiments. The portion of a gate structure associated with the thin oxide portion of the split gate architecture is etched after angle doping in some embodiments. Dopants in the gate oxide increase the etching rate in some embodiments. The portion of the gate structure associated with the thick oxide portion of the split gate is not doped in the angle doping operation due to the height of the spacer and therefore, is not etched as quickly as the portion of the gate structure associated with the thin oxide portion in some embodiments. After etching, a thin layer of gate oxide is deposited followed by a high K layer deposition process to provide a gate structure comprised of the thick oxide portion and the thin oxide portion in some embodiments.

In some embodiments, the split gate structure is used in power applications or in memory applications. In a memory application, a current applied to the gate conductor can be sensed through a bit-line connected to the source/drain region via the channel of the anti-fuse transistor.

In some embodiments, a one-time programmable cell is a one transistor or two transistor implementation. The one-time programmable cell is provided on a fin-shaped field effect transistor (FINFET or FinFET) structure or is provided on a bulk substrate (e.g., silicon, silicon germanium, germanium, silicon-on-insulator (SOI), etc.). The gate structure can be formed using a 16 nm or less (e.g., 10 nm and 7 nm) design rule fabrication system in some embodiments. In some embodiments, the gate structure has thick and/or thin gate dielectric portions that have a width (e.g., in the gate length direction) less than the critical dimension of the fabrication process for masked features. In some embodiments, fabrication steps consistent with available equipment and fabrication techniques can be used to form the split gate structure according to dimensions below the critical dimension.

In some embodiments, a programmable cell includes a split gate structure including a thin gate dielectric region and a thick gate dielectric region disposed below a gate conductor. The thin gate dielectric region has a width less than 30 nm. A thickness of the thick dielectric region is more than a thickness of the thin dielectric region. The programmable cell also includes a source/drain region.

In some embodiments, a method of forming a split gate transistor includes angle doping a substrate having an aperture to dope a first portion of a gate oxide at a bottom of the aperture. The method also includes removing the first portion of the gate oxide to expose a top surface of the substrate. A second portion of the gate oxide at the bottom of the aperture covers the substrate. The method also includes providing a gate dielectric material over an area associated with the first portion and over the second portion to form a gate dielectric structure having a thicker portion and a thinner portion. The thicker portion has a greater thickness than the thinner portion.

In some embodiments, a method of manufacturing a programmable cell includes providing a substrate having an aperture for a gate structure. A first gate dielectric layer is disposed at a bottom of the aperture. The method also includes selectively doping the first gate dielectric layer to have a first selective portion and a second selective portion. The first selective portion has a greater concentration of dopants than the second selective portion. The method also includes etching the first gate dielectric layer. The first gate dielectric layer at the first selective portion is removed at a faster rate than the first gate dielectric layer at the second selective portion. The method also includes depositing a second gate dielectric layer over the first gate dielectric layer. A first gate dielectric portion at a first area associated with the first selective portion is thinner than a second gate dielectric portion at a second area associated with the second selective portion.

In some embodiments, a variable thickness gate oxide anti-fuse transistor device can be employed as a memory cell in a non-volatile, one-time-programmable memory array application. In some embodiments, the anti-fuse transistor can be fabricated with standard complementary metal oxide semiconductor (CMOS) process steps, and is configured as a standard transistor element having a source region, a metal gate and an optional drain region. The gate oxide thickness underneath the gate conductor includes a thick gate oxide region and a thin gate oxide region and the thin gate oxide region acts as a localized breakdown voltage zone. A conductive channel between the gate conductor and the channel region can be formed in the localized breakdown voltage zone during a programming operation.

The terms metal oxide semiconductor (MOS) transistor, MOS field effect transistor (FET), and FET refer to any transistor including but not limited to FETs, metal insulator semiconductor (MIS) transistors, half-transistors or capacitor structures. The structures described herein using positive-type (P-type) or negative-type (N-type) dopants are not described in a limiting fashion; the structures can be configured for use with opposite type dopants discussed herein. Further, the concentration of such dopants and types of elements used for doping are not disclosed in a limiting fashion.

With reference to FIG. 1, a structure 100 can be embodied as a memory cell, such as a single transistor memory cell. Structure 100 includes a split gate structure 102, a substrate 103, a source/drain region 120, a conductive via 122, an interlayer dielectric layer 124 (e.g., interlayer or interlevel dielectric layer 0 (ILD0)), and a shallow trench isolation (STI) structure 130. Structure 100 is located in a region for input/output devices on substrate 103 in some embodiments. Structure 100 is located in a region for core devices on substrate 103 in some embodiments.

Structure 100 can serve to store logic 1 or 0 according to a one-time programmable scheme in some embodiments. In some embodiments, the cell can be selected and programmed via a word line coupled to split gate structure 102, and the stored value in the cell can be read through a bit line coupled to conductive via 122. In some embodiments, the cell is provided in an array of cells disposed on an I/O device region of substrate 103 as part of a larger integrated circuit. In some embodiments, the cell is a two transistor (2T) cell including an anti-fuse device utilizing split gate structure 102 and a pass device.

In some embodiments, substrate 103 is a FINFET-type structure or bulk substrate. Substrate 103 is a germanium substrate, silicon substrate, silicon-on-glass substrate, silicon-on-insulator substrate or silicon germanium substrate, or other substrate for integrated circuits. Substrate 103 is doped with P-type, N-type dopants or is fully depleted in some embodiments.

Split gate structure 102 is 200-400 nanometers (nm) thick (e.g. 300 nm thick) from a top 105 to a bottom 107 and less than 15 nm wide to less than 90 nm wide (e.g., 70-80 nm wide) from a right side 109 to a left side 119 in some embodiments. Split gate structure 102 includes a gate conductor 104, a pair of sidewall spacers 106, a gate dielectric layer 113, and a high dielectric constant (K) gate dielectric layer 118 in some embodiments. Gate dielectric layer 113 includes a thick gate dielectric portion 112 and a thin gate dielectric portion 114. Split gate structure 102 provides programming and reading (e.g., select) operations for the memory cell associated with structure 100. Thin gate dielectric portion 114 is used for forming a resistive path in response to a programming voltage, and thick gate dielectric portion 112 is used for controlling a channel 115 in substrate 103 beneath split gate structure 102.

When a resistive path has not been formed through thin gate dielectric portion 114 and a normal or select voltage is applied to gate conductor 104, the equivalent circuit for the transistor associated with structure 100 is a capacitor and appreciable current (e.g., current indicative of a first storage state) does not flow to the bit line via source/drain region 120 and conductive via 122. When a programming voltage is applied to gate conductor 104, thin gate dielectric portion 114 breaks down and a resistive path from channel 115 to gate conductor 104 is formed. After the resistive path is formed and when a normal or select voltage is applied to gate conductor 104, appreciable current (e.g., current indicative of a second storage state) does flow to the bit line via source/drain region 120 and conductive via 122.

Gate conductor 104 is a polysilicon conductor (e.g., heavily doped with P-type dopants), a metal gate conductor, or other conductive material in some embodiments. Gate conductor 104 can be aluminum, tantalum nitride, tungsten, niobium and various alloys thereof. Gate conductor 104 is a stack of metal layers in some embodiments and includes copper in some embodiments. Gate conductor 104 is 200-400 nm thick (e.g., less than 300 nm thick) and 50-80 nm wide (e.g., 60 nm wide) and can serve as a word line for programming and select operations in some embodiments.

Spacers 106 are nitride spacers or other insulative or dielectric spacers in some embodiments. Spacers 106 are between 8 and 16 nm wide and 200-400 nm in height in some embodiments. Spacers 106 are formed in a conformal deposition and etch back process in some embodiments.

Thick gate dielectric portion 112 and thin gate dielectric portion 114 are disposed between high K gate dielectric layer 118 and substrate 103 in some embodiments. Gate dielectric layer 113 associated with thick gate dielectric portion 112 and thin gate dielectric portion 114 is a silicon oxide material (e.g., silicon dioxide) and can be formed by deposition, thermal growth or combinations thereof in some embodiments. Thick gate dielectric portion 112 and thin gate dielectric portion 114 have widths (from left to right in FIG. 1) according to a ratio with respect to each other, such as, 2 to 1, 3 to 1, 1.5 to 1, 1 to 1, 0.5 to 1, etc. in some embodiments. In some embodiments, the ratio of the width of thick gate dielectric portion 112 to the width of thin gate dielectric portion 114 is 2 to 1. Thick gate dielectric portion 112 is approximately 1-5 nanometers thick (e.g., 3 nm thick), and thin gate dielectric portion 114 is 0-2 nanometers thick (e.g., 1 nm thick) in some embodiments. The width of thick dielectric portion 112 is 20-60 nm (e.g., 40 nm) and the width of thin dielectric portion 114 is 10-30 nm (e.g., 20 nm) in some embodiments.

Source/drain region 120 is an epitaxial layer provided on substrate 103 in some embodiments. The epitaxial layer is a heavily doped (e.g., N+ or P+) silicon, germanium, silicon-germanium crystalline layer above a crystalline substrate, such as substrate 103, and is 5 to 70 nm nanometers thick (e.g., 30-60 nm) in some embodiments. In some embodiments, source/drain region 120 is doped with N-type dopants and is deposited by molecular beam epitaxy or otherwise grown or deposited on surface 121 of substrate 103.

Conductive via 122 is coupled to source/drain region 120. A silicide layer can be utilized to provide a connection between conductive via 122 and source/drain region 120. Conductive via 122 can be coupled to the bit line for structure 100. Conductive via 122 can be various conductive materials including but not limited to tungsten, aluminum alloys, titanium, etc.

Interlayer dielectric layer 124 is provided above source/drain region 120 and substrate 103. Interlayer dielectric layer 124 is a 200-400 nm thick layer of silicon dioxide in some embodiments. Interlayer dielectric layer 124 can be deposited by a tetraethyl orthosilicate (TEOS) process or other chemical vapor deposition process in some embodiments.

Shallow trench isolation structure 130 is provided in substrate 103. Gate conductor 104 is partially disposed over shallow trench isolation structure 130 in some embodiments. Shallow trench isolation structure 130 is formed in a trench etching and oxide fill process in some embodiments. One of the pair of spacers 106, the spacer which is not next to source/drain region 120, is provided above shallow trench isolation structure 130 in some embodiments.

In some embodiments, channel 115 has a channel length of approximately 60 nm (e.g., more than 60 nm). In some embodiments, the channel length can be other dimensions including dimensions less than 60 nm.

Split gate structure 102 includes high K gate dielectric layer 118. High-K gate dielectric layer 118 is a metal oxide high-K dielectric layer (e.g., nitride and hafnium silicates (HfSiON), hafnium dioxide (HfO$_2$), hafnium silicon oxide (HfSiO), cesium oxide, tantalum oxide, etc.). Other materials include zirconium silicate, zirconium dioxide, etc. High K gate dielectric layer 118 is deposited by molecular layer deposition or atomic layer deposition and is 0-4 nm thick (e.g., 2 nm) in some embodiments.

Figure 2:
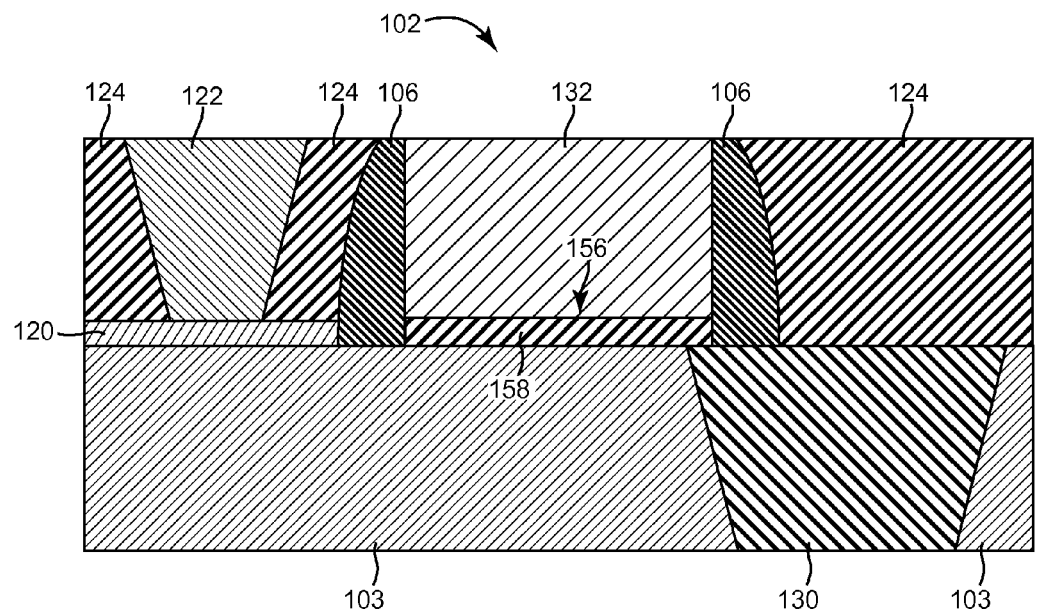
FIG. 2 is a cross sectional view schematic drawing of a substrate with a gate structure showing an operation for fabricating the programmable memory cell illustrated in FIG. 1 according to some exemplary embodiments.

With reference to FIGS. 1-6, fabrication of structure 100 is described below. With reference to FIG. 2, substrate 103 is provided with the various structures discussed with reference to FIG. 1. In FIG. 2, substrate 103 includes a gate dielectric layer 158 below a polysilicon layer 132 in some embodiments. The portion of substrate 103 shown in FIG. 2 can be associated with input/output (I/O) device fabrication in some embodiments.

In some embodiments, gate dielectric layer 158 is a 4 nm thick layer of gate oxide and polysilicon layer 132 is 200-400 nm thick. Gate dielectric layer 158 can be grown or deposited on substrate 103 and polysilicon layer 132 is deposited as polysilicon material (doped or undoped) and masked and etched to leave polysilicon layer 132 above gate dielectric layer 158 in some embodiments. Gate dielectric layer 158 is deposited in an I/O device oxide deposition operation in some embodiments.

Spacers 106 can be formed in a conformal deposition and etch back operation using polysilicon layer 132 in some embodiments. In some embodiments, polysilicon layer 132 serves as a structure for forming spacers 106 and as a sacrificial or dummy layer as explained below. After spacers 106 are formed, source/drain region 120 is deposited and doped. Interlayer dielectric layer 124 is deposited over source/drain region and shallow trench isolation structure 130 and planarized in some embodiments. Conductive via 122 is formed in a mask (e.g., gate mask), etching and deposition operation in some embodiments. Conductive via 122 can be formed before or after split gate structure 102 (FIG. 1) is completed.

Trenches for shallow trench isolation structure 130 can be formed in a reactive ion etch process followed by an insulating layer deposition process and a chemical mechanical polishing process (CMP). Shallow trench isolation structure 130 is formed before gate dielectric layer 158 and polysilicon conductor 132 are formed in some embodiments. The material for shallow trench isolation structure 130 can include one or more of silicon oxide, silicon nitride, silicon oxide nitride, fluoride-doped silicate (FSG), and/or a low-K dielectric material. Shallow trench isolation structure 130 is disposed partially underneath spacer 106, interlayer dielectric layer 124 and gate dielectric layer 158 in some embodiments. In some embodiments, shallow trench isolation structure 130 does not overlap high K gate dielectric layer 158 or does not overlap either of spacer 106 and high K gate dielectric layer 158.

Lightly doped drains and silicided features (e.g., nickel silicide (NiSi) material above source/drain region 120) can be included in structure 100 shown in FIG. 2. A chemical mechanical technique (CMP) is used to expose polysilicon layer 132 for removal in some embodiments.

Figure 3:
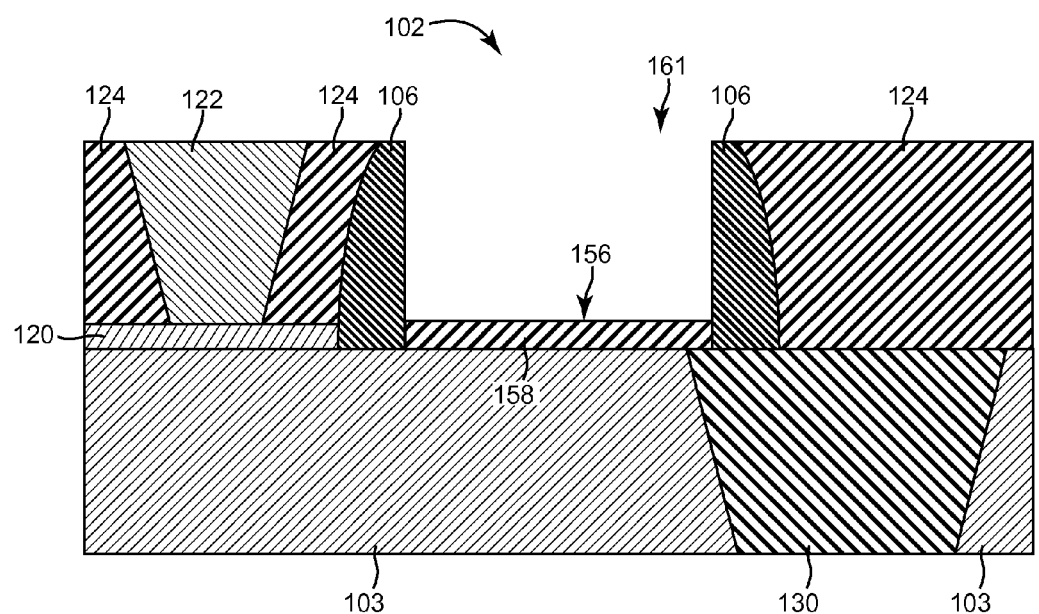
FIG. 3 is a cross sectional view schematic drawing of the substrate illustrated in FIG. 2 showing an operation for fabricating the programmable memory cell illustrated in FIG. 1 according to some exemplary embodiments.

With reference to FIG. 3, polysilicon layer 132 is removed using a wet etch to remove larger portions of polysilicon material followed by a soft dry etch to remove the remaining polysilicon layer 132 in some embodiments. A fluoride compound in a wet chemical etching operation selective to polysilicon is utilized in some embodiments. The chemical etching operation utilizes a solution including an etching chemical including but not limited to NH$_4$OH, NH$_3$(CH$_3$) OH, NH$_2$ (CH$_3$)2OH, NH(CH$_3$)3OH, N(CH$_3$)4OH or any combination thereof in some embodiments. In some embodiments, an NH$_4$OH solution having a concentration of 1% can be used as an etching chemical for the etching operation. In some embodiments, a dry etch, other wet etch, or polysilicon removal technique is used. When polysilicon layer 132 is removed and an aperture 161 is formed, gate dielectric layer 158 is exposed at a top surface 156.

Figure 4:
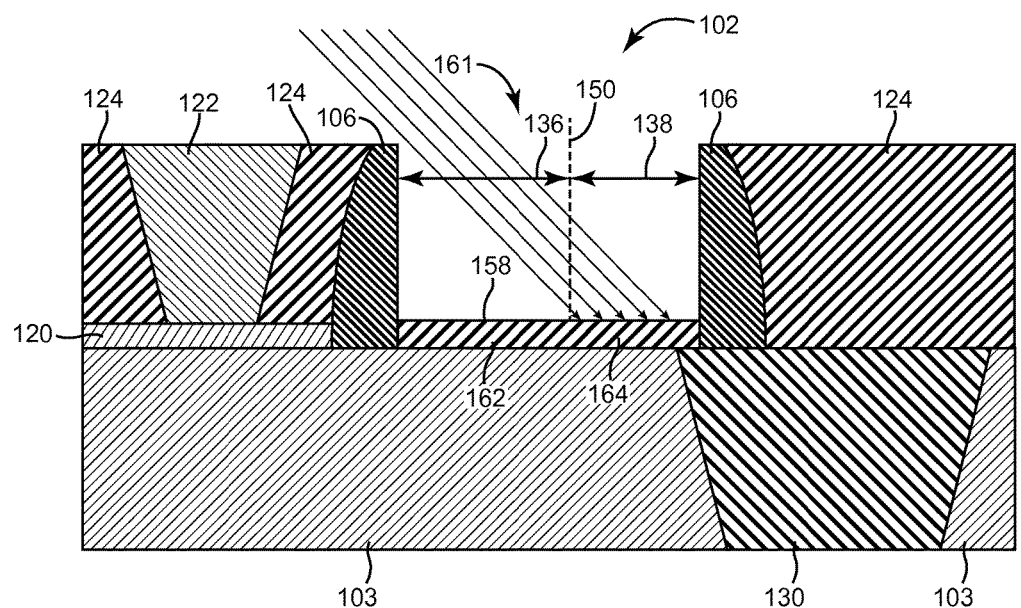
FIG. 4 is a cross sectional view schematic drawing of the substrate illustrated in FIG. 3 showing an operation for fabricating the programmable memory cell illustrated in FIG. 1 according to some exemplary embodiments.

With reference to FIG. 4, gate dielectric layer 158 is doped using aperture 161 formed according to a minimal channel length associated with I/O device design rules in some embodiments. Ion implantation is performed at an angle to selectively dope gate dielectric layer 158 to have an undoped portion 162 (e.g., corresponding to thick gate dielectric portion 112 (FIG. 1)) and a doped portion 164 (e.g., corresponding to thin gate dielectric portion 114 (FIG. 1)). The doping is performed at an angle to achieve the appropriate size of undoped portion 162 with respect to doped portion 164.

In some embodiments, the angle can be adjusted according to the height of spacers 106 and the desired size of undoped portion 162 and doped portion 164. Various angles can be chosen based upon the width of aperture, height of spacers 106 or aperture 161, desired width 138 of doped portion 164 and the desired width 136 of undoped portion 162. The greater the angle of implantation (e.g., the angle between a line 150 perpendicular gate dielectric layer 158 and the ray of implantation), the larger undoped portion 162 is with respect to doped portion 164. In some embodiments, the implantation angle is less than 90 and the implantation is provided on three sides of a FINFET structure. In some embodiments, the implantation angle is a small angle, such as, less than 5 degrees (e.g., less than 1 degree). In some embodiments, undoped portion 162 has a width two-thirds of the gate length and doped portion 164 has a width one-third of the gate length. Other width ratios are possible depending upon design criteria and system parameters.

In some embodiments, doped portion 164 is doped using Argon (Ar) dopants at a dose of $2\times10^{14}$ dopants per centimeter squared (cm$^2$). The depth of ion implantation reaches the bottom of doped portion 164 or a level above the bottom in some embodiments. In some embodiments, carbon (C) dopants are utilized. In some embodiments, gate dielectric layer 158 is doped so that doped portion 164 has a higher etching rate (e.g., 3-8 times) with respect to undoped portion 162. In some embodiments, the etching rate of doped portion 164 is five times the etching rate associated with doped portion 164 in a chemical wet etch operation. Other etching rate ratios are possible depending upon design criteria and system parameters.

Figure 5:
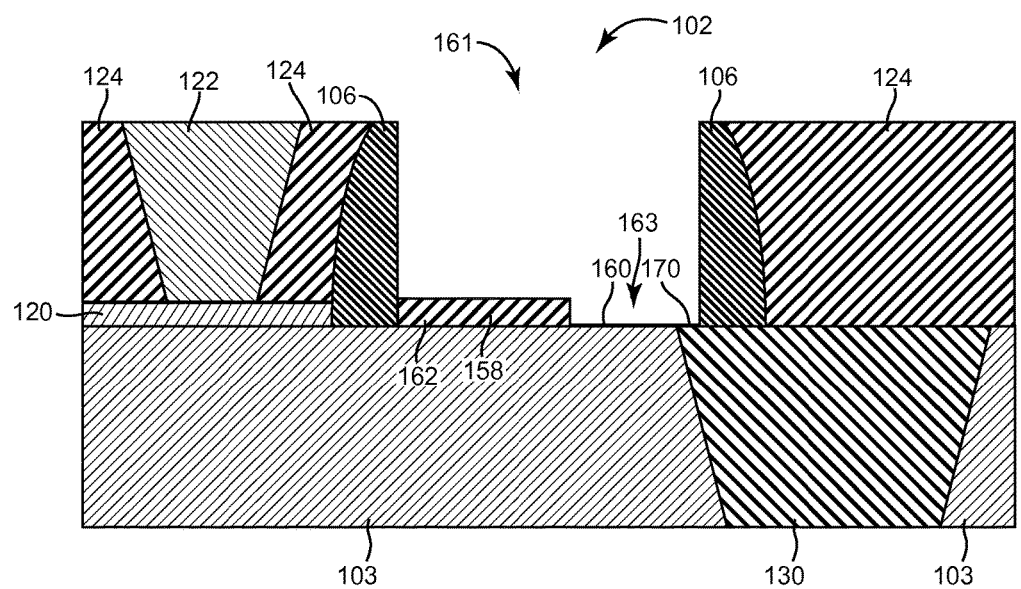
FIG. 5 is a cross sectional view schematic drawing of the substrate illustrated in FIG. 4 showing an operation for fabricating the programmable memory cell illustrated in FIG. 1 according to some exemplary embodiments.

With reference to FIG. 5, gate dielectric layer 158 is subjected to etching in some embodiments. The etching removes all or almost all of doped portion 164 in some embodiments. In some embodiments, top surface 160 is exposed at the area associated with doped portion 164 and a thickness of approximately 3 nm is left for undoped portion 162 in some embodiments. A portion 170 of shallow trench isolation structure 130 is exposed in some embodiments.

In some embodiments, etching is performed according to a core device oxide pre-clean operation. The core device oxide pre-clean operation removes native undoped oxide thickness of approximately 7 to 8 Angstroms (Å) in core devices and removes 7 to 8 Å of thickness from undoped portion 162 and 35-40 Å of thickness from doped portion 164. Advantageously, doped portion 164 is removed at a higher rate (e.g., 5 times) than undoped portion 162 in some embodiments. A thickness of 3 nm for undoped portion 162 is thick enough to support 1.8 Volt (V) signals (e.g., in a 28 nm design rule system, a thickness of 2.8 nm is sufficient) in some embodiments.

Figure 6:
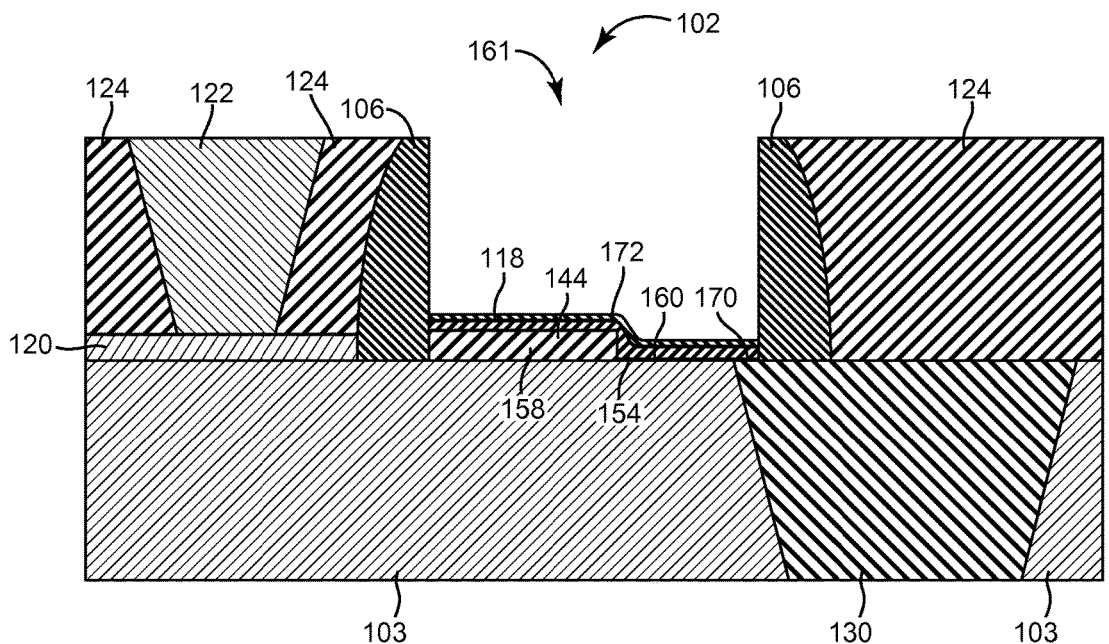
FIG. 6 is a cross sectional view schematic drawing of the substrate illustrated in FIG. 5 showing an operation for fabricating the programmable memory cell illustrated in FIG. 1 according to some exemplary embodiments.

With reference to FIG. 6, after removing doped portion 164, a gate dielectric layer 172 is provided above remaining undoped portion 162 and top surface 160 at aperture 163 (FIG. 5). Aperture 163 extends over shallow trench isolation structure 130 in some embodiments. Gate dielectric layer 172 is provided in a core oxide deposition process in some embodiments. Gate dielectric layer 172 is a silicon oxide material (SiO$_2$) and is grown or deposited in some embodiments. Chemical vapor deposition (CVD) can be utilized in some embodiments.

After gate dielectric layer 172 is formed, high K gate dielectric layer 118 is provided over gate dielectric layer 172 in some embodiments. In some embodiments, high K gate dielectric layer 118 is formed by atomic layer deposition (ALD) or molecular layer deposition (MLD). With reference to FIG. 1, gate conductor 104 is formed above high K gate dielectric layer 118 in a metal gate stack formation operation.

Figure 7:
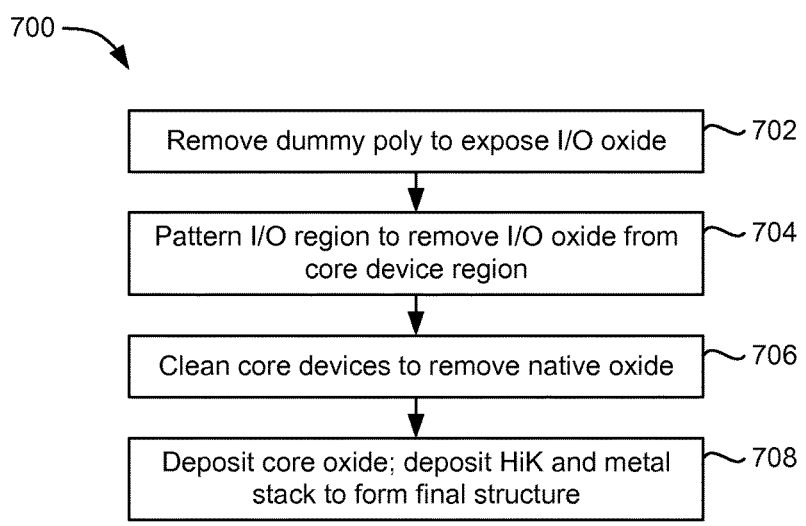
FIG. 7 is a flow diagram showing operations for fabricating the programmable memory cell illustrated in FIG. 1 according to some exemplary embodiments.

With reference to FIG. 7, a flow 700 for fabricating structure 100 utilizes core and I/O fabrication operations. At an operation 702, polysilicon layer 132 (FIG. 2) (e.g., a polysilicon gate conductor) is removed according to a dummy polysilicon removal technique. At an operation 704, substrate 103 is patterned according to I/O regions to remove I/O oxide material from core device regions using a chemical etch, such as, a wet etch. The I/O devices (including structure 100) is covered by a mask to protect I/O oxide material in the I/O device region during the wet etch in some embodiments.

At an operation 706, a mask is provided over the core device region and the I/O device region except for structure 100 and similar structures in some embodiments. The mask protects core devices and I/O devices during the ion implantation step. Angled ion implantation is performed to form undoped portion 162 (FIG. 3) and doped portion 164 in an implantation tool.

Structure 100 can be transferred to a deposition tool, (e.g., high K deposition tool) after ion implantation in some embodiments. Pre-cleaning is performed to remove native oxide from core devices. The pre-cleaning is performed on core devices in core regions and structure 100 (and any other similar structures) in I/O regions. A mask can protect I/O devices during pre-cleaning. The pre-clean is budgeted to reduce the thickness of undoped portion 162 (FIG. 3) by 8 Å and reduce the thickness of doped portion 164 by 40 Å in some embodiments. In an operation 708, core oxide deposition, high K deposition and metal stack deposition is performed to complete structure 100 in FIG. 1.

Figure 8:
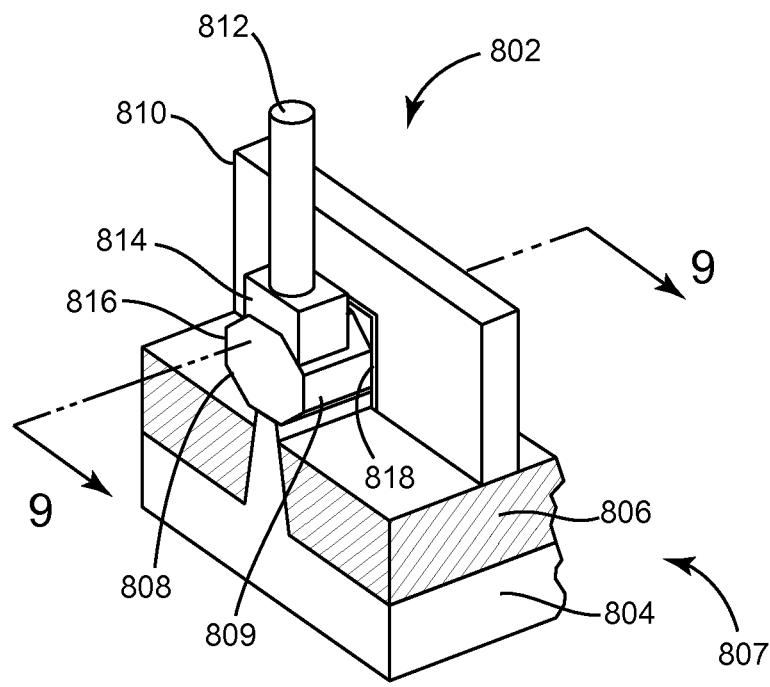
FIG. 8 is a perspective view schematic drawing of a single transistor programmable memory cell on a fin-shaped, field effect transistor structure according to some exemplary embodiments.

With reference to FIG. 8, a FINFET structure 802 similar to structure 100 described with reference to FIG. 1 is a one-time programmable cell according to some embodiments. FINFET structure 802 includes a FINFET substrate 807, a gate conductor 810, a contact 812, a silicide region 814 and a source/drain region 816.

FINFET substrate 807 includes an insulating later 806 and a semiconductor layer 804. Semiconductor layer 804 includes a fin-shaped portion 809. Fin-shaped portion 809 includes a channel region surrounded by gate conductor 810 and source/drain region 816 associated with silicide region 814.

Gate conductor 810 is provided above a gate dielectric layer 818 which includes a thick and thin portion similar to thick gate dielectric portion 112 and thin gate dielectric portion 114 discussed with reference to FIG. 1. Gate dielectric layer 818 can be formed according to the operations described above with respect to FIGS. 1-7. Gate dielectric layer 818 with its thin and thick gate dielectric portions are provided on three sides of fin-shaped portion 809 in some embodiments.

Figure 9:
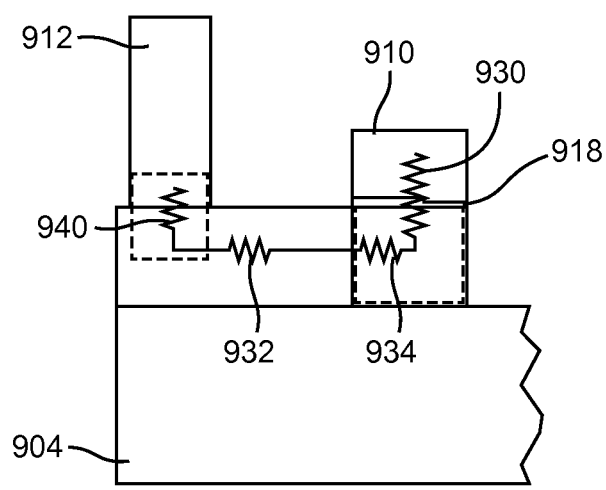
FIG. 9 is a cross sectional view schematic drawing of the single transistor programmable memory cell illustrated in FIG. 8 about line 9-9 according to some exemplary embodiments.

With reference to FIG. 9, a breakdown resistance 918 through gate dielectric layer 818 represents the resistance associated with gate dielectric layer 818. Resistance is high when a programming voltage has not been applied to gate conductor 810 and low when a programming voltage causes breakdown to occur in the thin portion of gate dielectric layer 818. Gate resistance 930 represents the resistance associated with gate conductor 810. A channel resistance 934 represents the resistance associated with the channel region of fin-shaped portion 809 and a source/drain resistance 932 represents the resistance associated with source/drain region 816 of fin-shaped portion 809. A contact resistance 940 represents the resistance associated with contact 812 and silicide region 814. Current is sensed when FINFET structure 802 is read to determine the programming state based upon breakdown resistance 918 in some embodiments.

Figure 10:
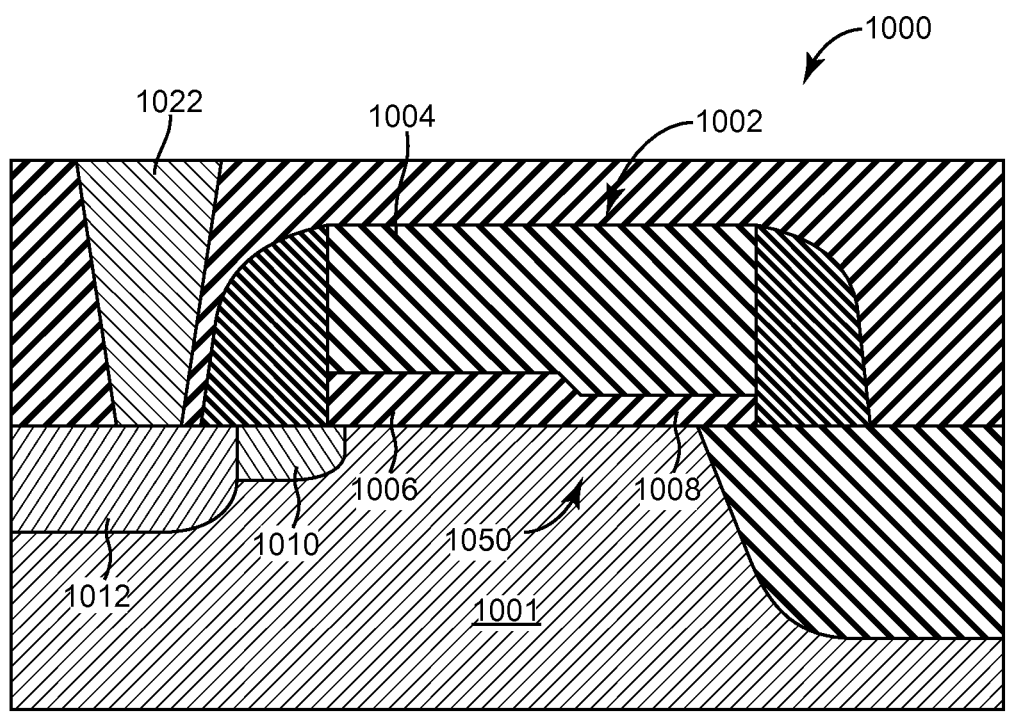
FIG. 10 is a cross sectional view schematic drawing of a single transistor bulk substrate programmable memory cell according to some exemplary embodiments.

With reference to FIG. 10, a circuit or structure 1000 provided on a bulk substrate 1001 can be fabricated according to operations discussed with reference to FIGS. 1-7. Structure 1000 includes a split gate structure 1002 including a gate conductor 1004, a thick gate oxide portion 1006 and a thin gate oxide portion 1008. Structure 1000 also includes a channel 1050 disposed underneath gate structure 1002, a source/drain region 1012, a lightly doped drain 1010, and a contact 1022. Contact 1022 is coupled with a source/drain region 1012. Contact 1022 is further coupled with a bit-line and gate conductor 1004 is connected to a word-line in some embodiments.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations. Further, the term source/drain region refers to a source region, a drain region, or a region that can be used as a source or a drain.

It should be understood that the circuits described above can provide multiple ones of any or each of those components. In addition, the structures, circuits and methods described above can be adjusted for various system parameters and design criteria, such as shape, depth, thicknesses, etc. Although shown in the drawings with certain components directly coupled to each other, direct coupling is not shown in a limiting fashion and is exemplarily shown. Alternative embodiments include circuits with indirect coupling between the components shown.

It should be noted that although the flowcharts provided herein show a specific order of method steps, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A programmable cell, comprising:
   a split gate structure comprising a thin gate dielectric region and a thick gate dielectric region disposed below a gate conductor, the thin gate dielectric region having a width of less than 30 nm, wherein a thickness of the thick gate dielectric region is more than a thickness of the thin gate dielectric region; and
   a source/drain region.

2. The programmable cell of claim 1, wherein the thin gate dielectric region is a gate oxide region having a thickness of 1 nm or less and the thick gate dielectric region is a thick oxide region having a thickness of 3 nm or less.

3. The programmable cell of claim 2, wherein the split gate structure is 300 nm thick or less.

4. The programmable cell of claim 2, wherein the thin gate dielectric region is fabricated using an angled doping step.

5. The programmable cell of claim 1, wherein the programmable cell is a one-time programmable cell and the source/drain is a source, a drain, or a combination of source and drain.

6. The programmable cell of claim 1, wherein the programmable cell is provided on a bulk substrate or a fin-shaped field effect transistor (FINFET) substrate.

7. The programmable cell of claim 1, wherein the split gate structure further comprises a high K dielectric layer disposed over the thick gate dielectric region and the thin gate dielectric region.

8. A programmable cell, comprising:
   a split gate structure comprising a thin gate dielectric region and a thick gate dielectric region disposed below a gate conductor, the thin gate dielectric region having a width of less than 30 nm and fabricated using an angled doping step, wherein a thickness of the thick gate dielectric region is more than a thickness of the thin gate dielectric region; and
   a source/drain region.

9. A programmable cell, comprising:
   a split gate structure comprising a thin gate dielectric region and a thick gate dielectric region disposed below a gate conductor, the thin gate dielectric region having a width of less than 30 nm, wherein a thickness of the thick gate dielectric region is more than a thickness of the thin gate dielectric region;
   a source/drain region; and a high K dielectric layer disposed over the thick gate dielectric region and the thin gate dielectric region.

\* \* \* \* \*